(12) United States Patent
Barrow

(10) Patent No.: US 6,681,353 B1
(45) Date of Patent: Jan. 20, 2004

(54) METHODS AND APPARATUS FOR OBTAINING A TRACE OF A DIGITAL SIGNAL WITHIN A FIELD PROGRAMMABLE GATE ARRAY DEVICE

(75) Inventor: Jonathan J. Barrow, Canton, MA (US)

(73) Assignee: EMC Corporation, Hopkinton, MA (US)

(*) Notice: Subject to any disclaimer, the term of this patent is extended or adjusted under 35 U.S.C. 154(b) by 615 days.

(21) Appl. No.: 09/609,967

(22) Filed: Jul. 5, 2000

(51) Int. Cl.$^7$ .............................................. G01R 31/28
(52) U.S. Cl. ........................ 714/725; 702/117; 716/4
(58) Field of Search ................................ 714/724, 725, 714/726, 734, 735, 30, 39; 702/117; 716/4

(56) References Cited

U.S. PATENT DOCUMENTS

| | | | | |
|---|---|---|---|---|
| 4,112,425 A | * | 9/1978 | Zobrist et al. | 341/110 |
| 5,425,036 A | * | 6/1995 | Liu et al. | 714/735 |
| 5,771,240 A | * | 6/1998 | Tobin et al. | 714/724 |
| 6,182,247 B1 | * | 1/2001 | Herrmann et al. | 714/39 |

OTHER PUBLICATIONS

*Xcell Journal 36 Q2 00*, "On–chip, Real–time Logic Analysis with ChipScope ILA," Xilinx, Inc., San Jose, CA, 2000, pp. 19–21.
*Xcell Journal 31 Q1 99*, "Internet Reconfigurable Logic for Creating Web–enabled Devices," Xilinx, Inc., San Jose, CA, 1999, pp. 6–7.
http://www.xilinx.com/prs_rls/xotools.htm, "Xilinx Releases Tools for Creating Xilinx Online Applications," Xilinx, Inc., San Jose, CA, May 25, 1999, pp. 1–3.

* cited by examiner

*Primary Examiner*—Emmanuel L. Moise
(74) *Attorney, Agent, or Firm*—Chapin & Huang, L.L.C.; David E. Huang, Esq.

(57) ABSTRACT

The invention is directed to techniques which use a test circuit within an FPGA device to obtain a trace of a digital signal used by normal operating circuitry of the FPGA device. The test circuit stores the trace in memory of the FPGA device which is accessible without the need of a logic analyzer (e.g., accessible in a memory mapped or I/O mapped manner). Accordingly, the deficiencies of a conventional built-in approach (e.g., including a mounted connector and connections by sacrificing circuit board area) and soldering approach (e.g., soldering wires to the circuit board requiring time and effort, and increasing the likelihood of signal distortion) for logic analyzer access are avoided. One arrangement of the invention is directed to a computer system having a bus, a processor coupled to the bus, and an FPGA device coupled to the bus. The FPGA device includes (i) normal operating circuitry for performing a normal operating function of the FPGA device, and (ii) a test circuit coupled to the normal operating circuitry. The test circuit is configured to obtain a trace of a digital signal used by the normal operating circuitry. In particular, the test circuit receives, from the processor and through the bus, a control signal enabling capture of the digital signal. The test circuit then captures samples of the digital signal in response to the control signal, and stores the captured samples of the digital signal in the test circuit. The captured samples form the trace of the digital signal. Accordingly, the circuit board designer can avoid the deficiencies of using a logic analyzer, and perform a test-and-debug procedure using the test circuit of the FPGA device.

29 Claims, 6 Drawing Sheets

METHODS AND APPARATUS FOR OBTAINING A TRACE OF A DIGITAL SIGNAL WITHIN A FIELD PROGRAMMABLE GATE ARRAY DEVICE

BACKGROUND OF THE INVENTION

A typical field programmable gate array (FPGA) device is a customizable integrated circuit (IC) device having, at least initially, a matrix of non-dedicated gates. A user customizes the FPGA device to perform one or more specific functions. In particular, the user forms customized FPGA circuitry within the device by specifying configuration details such as interconnections between gates, initial operating states, etc. Some FPGA devices include random access memory (RAM), e.g., 16 kilobytes, which the customized FPGA circuitry can utilize during operation.

A designer of a circuit board typically performs a test-and-debug process on a circuit board prior to permitting the circuit board to be manufactured on a large scale for commercial use. If the circuit board includes an FPGA device (i.e., if the circuit board has an FPGA device mounted thereon), the circuit board designer may wish to examine the signals entering and/or leaving the device. To examine these signals, the circuit board designer typically connects a logic analyzer, storage oscilloscope, etc. (hereinafter generally referred to as a logic analyzer) to the FPGA device. The designer then uses the logic analyzer to capture samples of these signals, and compares the captured samples to an expected set of samples. This process enables the designer to identify and correct any design problems (e.g., programming errors) relating to the FPGA device.

One approach to connecting the logic analyzer to the FPGA device involves designing the circuit board such that it includes a circuit board connector mounted thereon, and circuit board connections (metallic etching) leading from the mounted circuit board connector to various leads or pads of the FPGA device. With this approach (hereinafter referred to as the "built-in approach"), the designer can then simply attach a cable from the logic analyzer to the connector mounted on the circuit board in order to electronically access the FPGA device.

Another approach to connecting the logic analyzer to an FPGA device involves attaching wires to portions of the circuit board. In this approach (hereinafter referred to as the "soldering approach"), the circuit board designer typically enlists the assistance of a person skilled in soldering wires to circuit boards. The designer instructs that person to solder, or hardwire, colored wires to particular metallic circuit board vias which lead to the FPGA device. The designer then attaches a cable from the logic analyzer to the soldered colored wires in order to electronically access the FPGA device.

SUMMARY OF THE INVENTION

Unfortunately, there are certain deficiencies in conventional approaches for electronically accessing an FPGA device using a logic analyzer. For example, the built-in approach, which requires the circuit board designer to include a mounted circuit board connector and circuit board connections leading from the connector to pads of the FPGA device, requires sacrificing a substantial amount of circuit board area for the connector (the connector "footprint"), and the circuit board connections. Often the placement of such connections has routing and signal integrity consequences on neighboring areas of the circuit board as well.

Additionally, the soldering approach, which requires a person to solder colored wires to circuit board vias leading to the FPGA device, is prone to mistakes. That is, the person soldering the colored wires to the vias can easily make mistakes by soldering a wrong-colored wire to a particular via, soldering a properly-colored wire to the wrong via, etc. Moreover, the addition of the solder and wires to the circuit board can change the electrical characteristics of the circuit board connections increasing the likelihood of distorting the signal samples captured from the circuit board. Such distortions can disrupt critical timing paths, particularly when dealing with high speed signals, thus making the samples unreliable. Also, the time and cost involved in having a skilled person meticulously solder wires to the circuit board can be substantial.

Furthermore, both the built-in and soldering approaches require the use of a logic analyzer to capture signals entering and/or leaving the FPGA device. A typical logic analyzer is expensive (e.g., $100K) and requires periodic maintenance. Additionally, a circuit board designer wishing to test and debug an FPGA device on a circuit board using the logic analyzer must invest time and effort into setting up and connecting the logic analyzer prior to the test-and-debug process.

Additionally, improvements in circuit board technologies have made the above-identified conventional approaches relatively expensive and difficult endeavors from non-monetary perspectives. In particular, surface mounting techniques, IC packages with inaccessible pads (e.g., Ball Grid Arrays), the trend towards using smaller pitches, and the trend towards placing modules on both sides of circuit boards have exacerbated the difficulties in connecting a logic analyzer to a circuit board in order to electronically access FPGA devices.

In contrast, the invention is directed to techniques which use a test circuit within an FPGA device to obtain a trace of a digital signal used by normal operating circuitry of the FPGA device. The test circuit stores the trace in memory of the FPGA device which is accessible without the need of a logic analyzer (e.g., accessible in a memory mapped or I/O mapped manner). Accordingly, the test circuit can operate as an embedded logic analyzer within the FPGA device. As such, the deficiencies of the conventional built-in approach (e.g., sacrificing circuit board area) and the soldering approach (e.g., time and effort soldering wires to the circuit board, signal integrity drawbacks, etc.) for obtaining electronic access to mounted FPGA devices using external logic analyzers are avoided.

One arrangement of the invention is directed to a computer system having a bus, a processor coupled to the bus, and an FPGA device coupled to the bus. The FPGA device includes (i) normal operating circuitry for performing a normal operating function of the FPGA device, and (ii) a test circuit coupled to the normal operating circuitry. The test circuit is configured to obtain a trace of a digital signal used by the normal operating circuitry. In particular, the test circuit receives, from the processor and through the bus, a control signal enabling capture of the digital signal. The test circuit then captures samples of the digital signal in response to the control signal, and stores the captured samples of the digital signal in the test circuit. The captured samples form the trace of the digital signal. Accordingly, the circuit board designer can avoid the deficiencies of using a logic analyzer by performing a test-and-debug procedure using the test circuit of the FPGA device.

In one arrangement, the test circuit of the FPGA device includes a controller and memory. The controller has a counter, and counter initialization circuitry coupled to the counter. The counter initialization circuitry is configured to (i) receive an initialization signal from the processor and through the bus, and (ii) initialize contents of the counter in response to the initialization signal. The contents of the counter identify memory locations of the memory for storing samples of the digital signal. Accordingly, the controller has an effective mechanism for addressing the memory of the test circuit.

In one arrangement, the controller further includes counter modification circuitry coupled to the counter. The counter modification circuitry modifies the contents of the counter in response to the control signal. In this arrangement, the control signal directs capture of the digital signal within the memory locations of the memory.

In one arrangement, the controller of the test circuit includes a selector that (i) receives a select signal from the processor and through the bus, and (ii) selects a portion of the normal operating circuitry from which to capture the samples of the digital signal based on the select signal. In this arrangement, the test circuit is not forced to capture samples from the same portion of the normal operating circuitry of the FPGA device. Rather, the test circuit can capture digital signal samples from different portions of the normal operating circuitry based on the select signal (e.g., input circuitry, output circuitry, internal circuitry, etc.).

Another arrangement of the invention is directed to a computer program product that includes a computer readable medium having instructions stored thereon. The instructions define a test circuit for a field programmable gate array device, such that the instructions, when processed by a computer running a hardware design application, cause the computer to generate a computer representation of the test circuit. The test circuit is configured to: (i) receive a control signal enabling capture of the digital signal used by normal operating circuitry of the field programmable gate array device, (ii) capture samples of the digital signal in response to the control signal, and (iii) store the captured samples of the digital signal in the test circuit. The captured samples form the trace of the digital signal. Accordingly, a design engineer can use the computer program product to incorporate the test circuit in a variety of FPGA device designs, and later test and debug the resulting FPGA devices using the incorporated test circuit.

In one arrangement, the instructions are hardware description language (HDL) instructions. The HDL instructions can be bundled in the form of an HDL module and combined with other HDL modules to form a larger FPGA device design.

It should be understood that other arrangements of the invention are directed to methods, devices, systems, etc. The features of the invention may be employed in data storage systems, and other computer-related systems and components such as those manufactured by EMC Corporation of Hopkinton, Mass.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

The invention is directed to techniques which use a test circuit within a field programmable gate array (FPGA) device to obtain a trace of a digital signal used by normal operating circuitry of the FPGA device. The test circuit stores the trace in memory of the FPGA device which is accessible without the need of a logic analyzer (e.g., accessible in a memory mapped or I/O mapped manner). Accordingly, the deficiencies of a conventional built-in approach (e.g., including a mounted connector and connections by sacrificing circuit board area) and soldering approach (e.g., soldering wires to the circuit board requiring time and effort, and increasing the likelihood of signal distortion) for electronically accessing the FPGA device using a logic analyzer are avoided. The techniques of the invention may be employed in computer-related systems and devices, such as those manufactured by EMC Corporation of Hopkinton, Mass.

Figure 1:
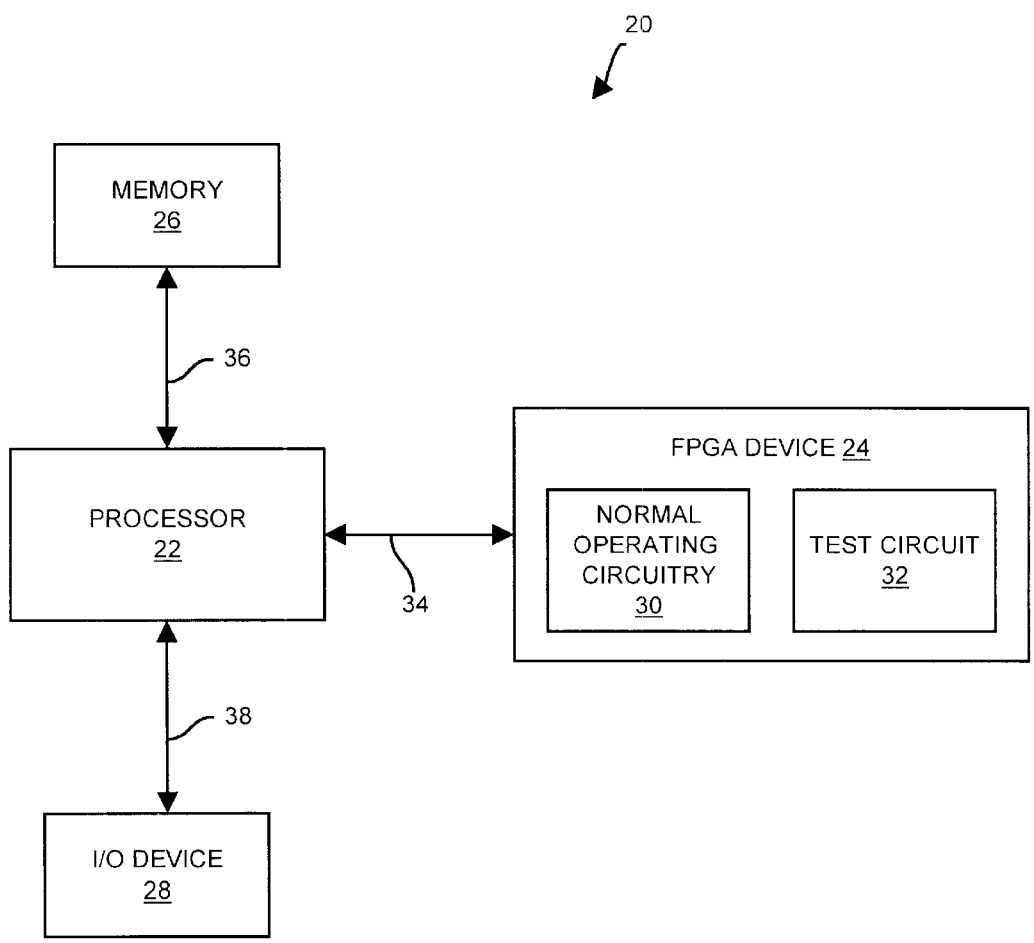
FIG. 1 is a block diagram of a computer system having an FPGA device which includes a test circuit for obtaining a trace of a digital signal.

FIG. 1 shows a computer system 20 which is suitable for use by the invention. The computer system 20 includes a processor 22, an FPGA device 24, memory 26 and an I/O device 28. The FPGA device 24 includes normal operating circuitry 30 for performing a normal operating function of the FPGA device 24, and a test circuit 32. The FPGA device 24 communicates with the processor 22 through a bus 34. Similarly, the memory 26 communicates with the processor 22 through a bus 36, and the I/O device 28 communicates with the processor 22 through a bus 38. In one arrangement, the processor 22 and the FPGA device 24 mount on the same circuit board.

The test circuit 32 of the FPGA device 24 is capable of storing a trace of a digital signal used by the normal operating circuitry 30 (e.g., an input signal, an output signal, and internally used signal, etc.) in response to control signals from the processor 22. Further details of the FPGA device 24 will now be provided with reference to FIG. 2.

Figure 2:
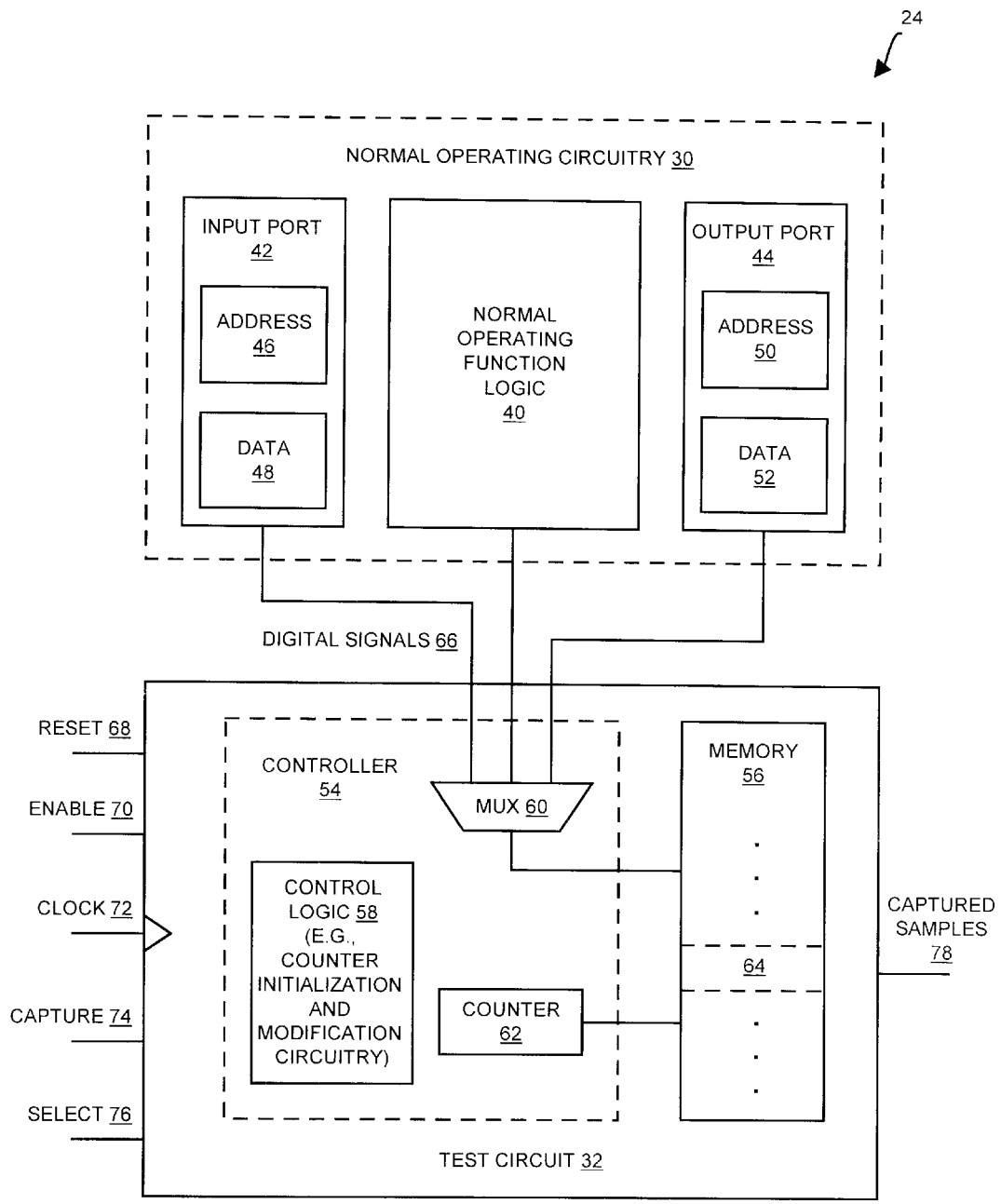
FIG. 2 is a block diagram showing particular features of the FPGA device of FIG. 1.

FIG. 2 is a more detailed block diagram of the FPGA device 24. The normal operating circuitry 30 of the FPGA device 24 includes normal operating function logic 40, an input port 42 and an output port 44. The input port 42 includes address circuitry 46 and data circuitry 48. Similarly, the output port 44 includes address circuitry 50 and data circuitry 50. In one arrangement, the address and data circuitry 46, 48, 50, 52 includes logic (e.g., latches) which operates as interfaces between the normal operating function logic 40 and the external circuits of the computer system 20 (e.g., other IC devices on the same circuit board). In an alternative arrangement, the address and data circuitry 46, 48, 50, 52 is simply electrical connections leading from the normal operating function logic 40 to the external circuits.

The test circuit 32 includes a controller 54 and memory 56. The controller 54 includes control logic 58, a multiplexor 60, and a counter 62. Contents of the counter 62 identify memory locations 64 within the memory 56. Furthermore, the multiplexor 60 selects particular digital signals 66 of the normal operating circuitry 30 for sampling (e.g., address and data signals from the input port 42).

The test circuit 32 receives to a variety of control signals including a reset signal 68, an enable signal 70, a clock signal 72, a capture signal 74 and a select signal 76. Additionally, the test circuit 32 provides captured samples 78 of the digital signals 66 from the normal operating circuitry 30. Further details of the operation of the computer system 20 will now be provided with reference to flow diagrams of FIGS. 3 and 4.

Figure 3:
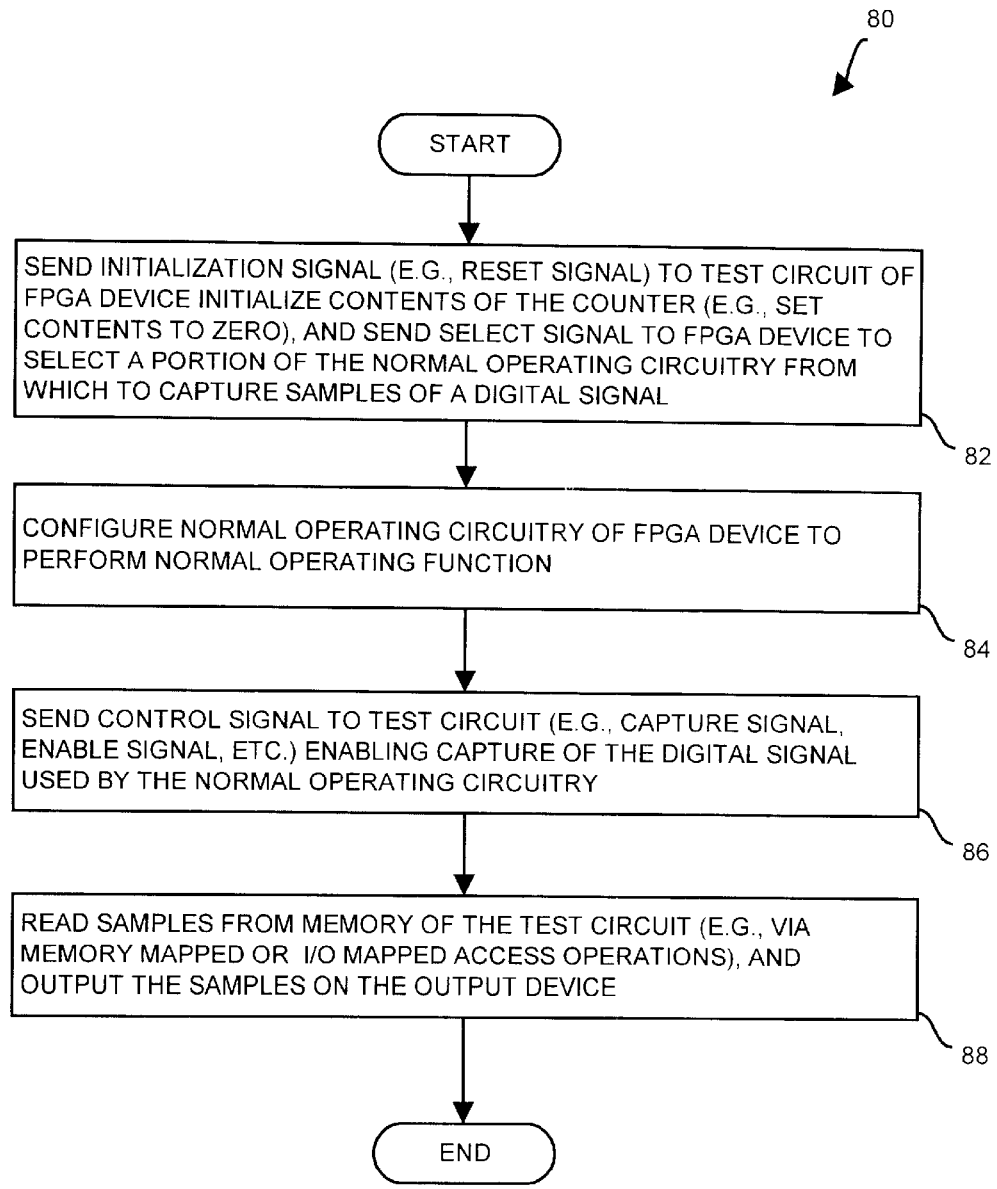
FIG. 3 is a flow diagram of a procedure performed by a processor of the computer system of FIG. 1.

FIG. 3 shows a procedure 80 which is performed by the processor 22 in order to obtain a trace of a digital signal 66 used by the normal operating circuitry 30. In one arrangement, a user operates the I/O device 28 to (i) load the memory 26 with a program, and (ii) direct the processor 22 to run the program in order to perform the procedure 80. As the processor 22 runs the program, the user interacts with the computer system 20 through the I/O device 28 (i.e., provides input commands and data, and receives output) in order to command the processor 22 to provide the control signals to the FPGA device 24 in order to direct the test circuit 32 within the FPGA device to obtain a digital signal trace.

In step 82, the processor 22 provides an initialization signal to the test circuit 32 of the FPGA device 24. In particular, the processor 22 sends the reset signal 68 to the FPGA device 24 through the bus 34 (also see FIGS. 1 and 2). Additionally, in step 102, the processor 22 sends the select signal 76 to the FPGA device 32 through the bus 34 to select a portion of the normal operating circuitry 30 from which to capture samples of a digital signal 66 (e.g., the input port 42).

In step 84, the processor 22 configures the normal operating circuitry 30 of the FPGA device 24 to perform a normal operating function (e.g., media access control layer operations for a network adaptor). In one arrangement, the normal operating function logic 40 provides output signals through the output port 44 in response to input signals received through the input port 42.

In step 86, the processor 22 sends a control signal to the test circuit 32 to enable the test circuit 32 to capture samples of the selected digital signal 66 used by the normal operating circuitry 30. In particular, the processor 22 sends the enable signal 70 (a first control signal) to the test circuit 32 which places the test circuit 32 in a state that is ready for capturing digital signal samples. Additionally, the processor 22 sends the capture signal 74 to the test circuit 32 which provides signal edges (e.g., rising edges) which the test circuit 32 uses to trigger the capture of the signal samples within the memory locations 64 of the memory 56.

In step 88, the processor 22 reads the captured samples 78 from the memory 56, and outputs the captured samples on the I/O de vice 28 for analysis by the user. In one arrangement, the processor 22 accesses the memory 56 in a memory mapped manner (i.e., treating the memory 56 as a portion of primary memory). In another arrangement, the processor 22 accesses the memory 56 in an I/O mapped manner (i.e., extracting contents of the memory 56 using memory addresses particular to the memory 56).

Figure 4:
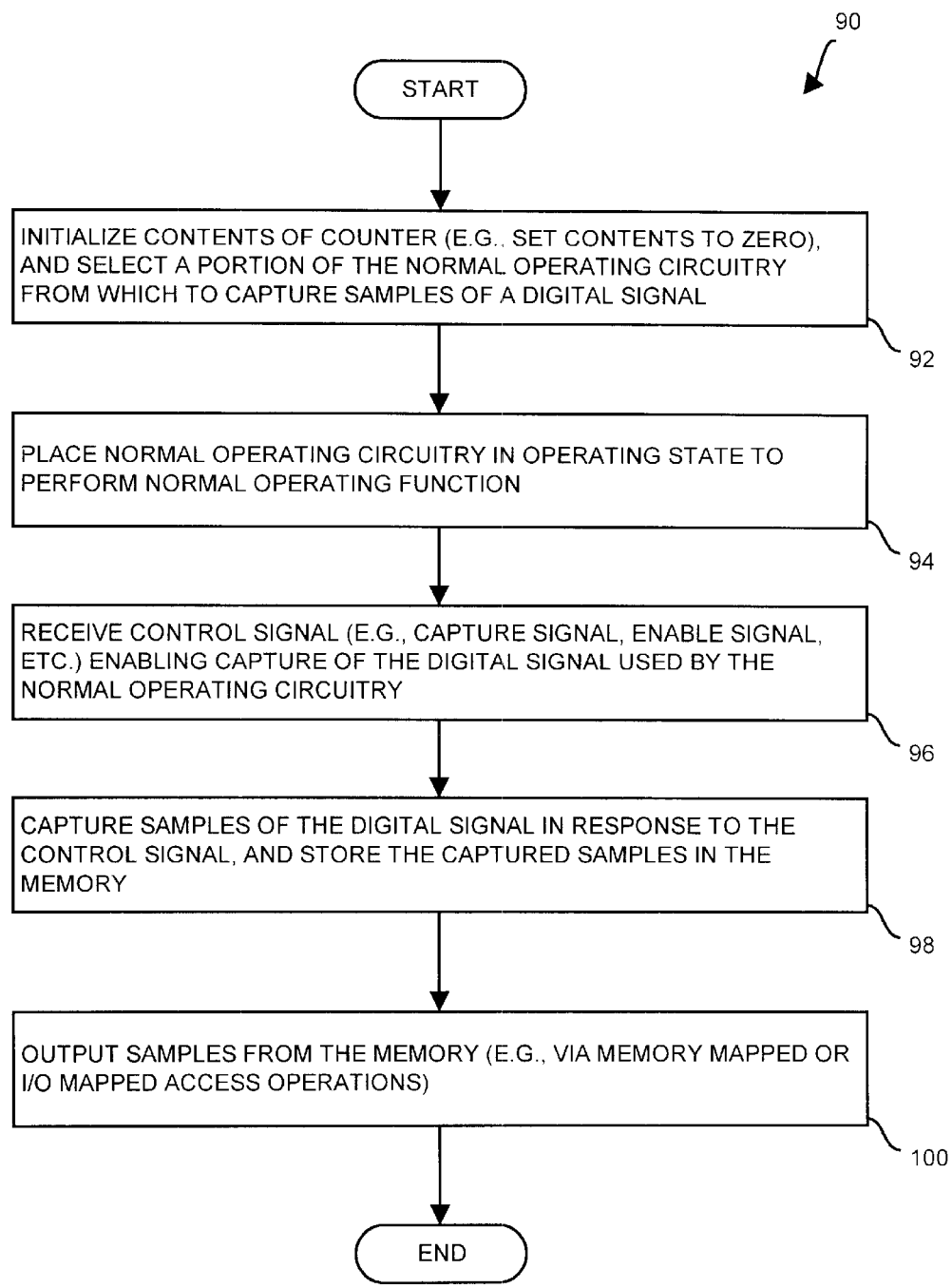
FIG. 4 is a flow diagram of a procedure performed by the FPGA device of FIG. 1.

FIG. 4 shows a procedure 90 which is performed by the FPGA device 24 in order to obtain a digital signal trace in response to the control signals from the processor 22. In step 92, the test circuit 32 initializes the contents of the counter 62 and selects a portion of the normal operating circuitry 30 from which to capture samples of a digital signal 66. In particular, the control logic 58 of the test circuit 32 sets the contents of the counter 62 to a predetermined value (e.g., zero) in response to an edge of the reset signal 68 (e.g., a rising edge), and the multiplexor 60 selects the portion of the normal operating circuitry 30 based on the select signal 76 (e.g., the input port 42).

In step 94, the normal operating circuitry 30 enters a normal operating state in order to perform a normal operating function. In one arrangement, the normal operating function logic 40 provides output signals through the output port 44 in response to input signals received through the input port 42.

In step 96, the test circuit 32 receives a control signal that enables the test circuit 32 to capture of the selected digital signal 66 used by the normal operating circuitry 30. In particular, the enable signal 70 (a control signal) places the control logic 58 of the test circuit 32 in a ready state (e.g., an "armed" state) in which the test circuit 32 is now capable of storing digital signal samples. Additionally, the capture signal 74 (another control signal) provides signal edges for the test circuit 32 to trigger or synchronize the capture of samples of the selected digital signal 66.

In step 98, the test circuit 32 captures samples of the selected digital signal 66 in response to the control signals (e.g., the enable signal 70 and the capture signal 74), and stores the captured samples in the memory 56. In particular, for each rising edge of the capture signal 74, and while the enable signal 70 enables the control logic 58 to capture signal samples, the memory 64 receives a sample of the selected digital signal 66 through the multiplexor 60, and stores that sample in a memory location 64 identified by the contents of the counter 62. The control logic 58 then increments the contents of the counter 62 such that it identifies the next adjacent memory location 64 of the memory for storing another signal sample.

In step 100, the test circuit 32 outputs the samples of the digital signal 66, i.e., the captured samples 78, from the memory 56. In one arrangement, the control logic 58 provides read access to the memory 56 so that an external device can extract the captured samples 78, i.e., a user can read from the memory 56 using memory mapped or I/O mapped read operations. In this manner, the user (e.g., a design engineer) can obtain a trace of a digital signal used by the normal operating circuitry 30 without a logic analyzer.

Figure 5:
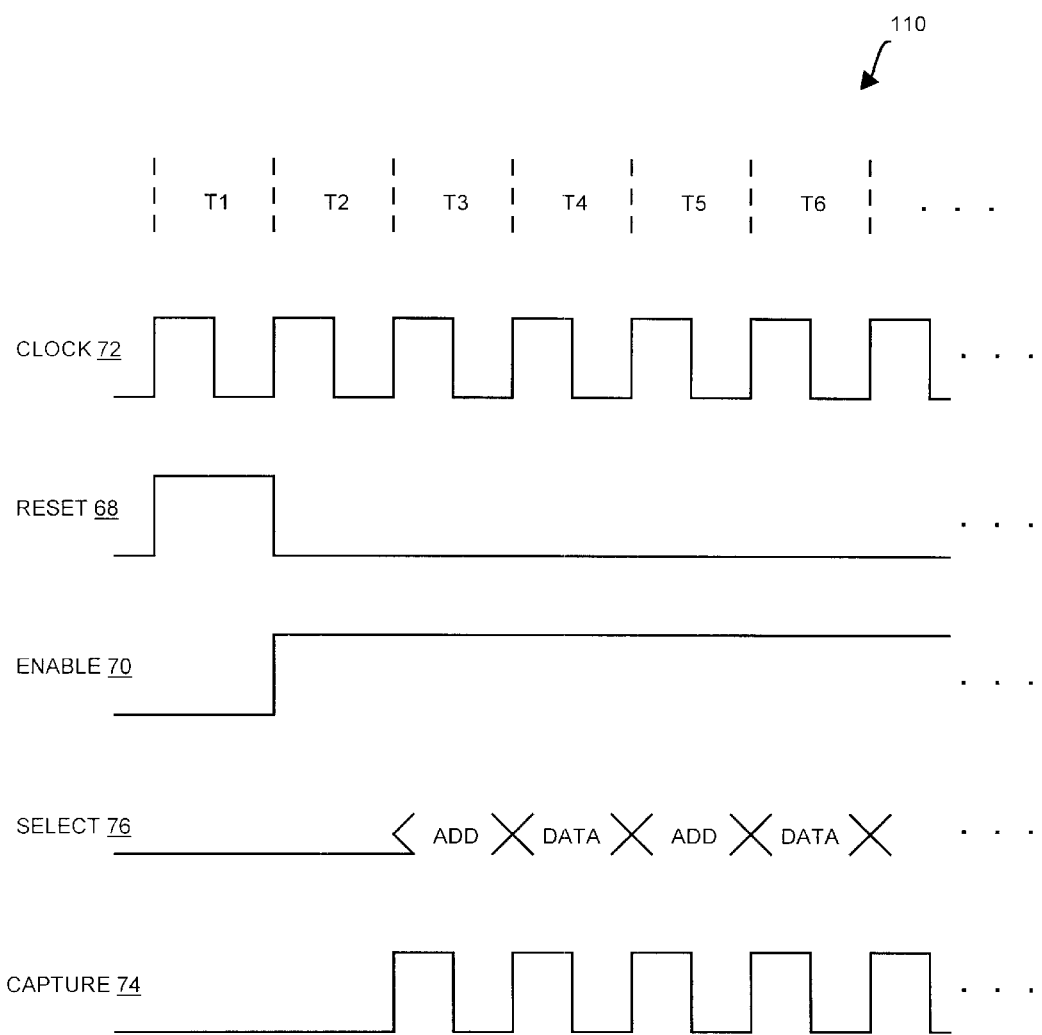
FIG. 5 is a timing diagram of particular signals utilized by the FPGA device of FIG. 1.

Further details of the operation of the FPGA device 24 will now be provided in the form of an example which makes reference to a timing diagram 110 in FIG. 5. Suppose that the FPGA device 24 is a network adaptor circuit which provides the computer system 20 with network access. By way of example only, further suppose that the normal operating function logic 40 includes media access control (MAC) layer circuitry for performing MAC address operations. As shown in FIG. 5, the test circuit 32 continuously receives the clock signal 72 which has rising and falling edges enabling the test circuit 32 to step through various operations.

In time period T1, the reset signal 68 (e.g., asserted for a single time period by way of example only) directs the control logic 58 of the FPGA device 24 to initialize the counter 62. In one arrangement, in time period T1, the select signal 76 directs the multiplexor 60 to select a portion of the normal operating circuitry 30 from which to sample a digital signal. However, in another arrangement and as shown in FIG. 5, the select signal 76 changes (e.g., selects the input address circuit 46, selects the input data circuit 48, selects the input address circuit 46 again, selects the input data circuit 48 again, and so on) thus directing the FPGA device 24 to select different portions of the normal operating circuitry 30 while collecting digital signal samples.

In time period T2 and beyond, the enable signal 70 places the test circuit 32 in a ready state or "armed" state in which the test circuit 32 is ready to collect digital signal samples.

In time periods T3 through T6, the user directs the normal operating circuitry 30 to perform its normal operating function (e.g., performing MAC address operations), and the select signal 76 and the capture signal 74 direct the test circuit 32 to obtain a trace of a digital signal (or signals) 66 used by the normal operating circuitry 30. As shown in FIG. 5, the select signal 76 alternates selection of an address signal and a data signal of the input port 42 used by the normal operating circuitry 30. The capture signal 74 provides signal edges (e.g., rising edges) which the test circuit 32 uses as a trigger to record samples of the selected digital signals 66 (the address and data signals). Accordingly, the test circuit 32 obtains a trace of the address signal and the data signal from the input port 42.

In one arrangement, the test circuit 32 only fills the memory 56 in response to rising (or falling) edges of the capture signal 74 in order to conserve memory locations 64 within the memory 56. In this arrangement, the capture signal 74 can remain at a high or low level for one or more time periods in order to prevent capture of digital signal samples and conserve memory. In another arrangement, the test circuit 32 continues to fill the memory 56 until the memory 56 is completely full. After the traces have been collected by the test circuit 32, the user can retrieve the traces from the memory 56 using memory access operations as described above, and compare the traces to expected traces in order to test and debug the FPGA device 24.

Figure 6:
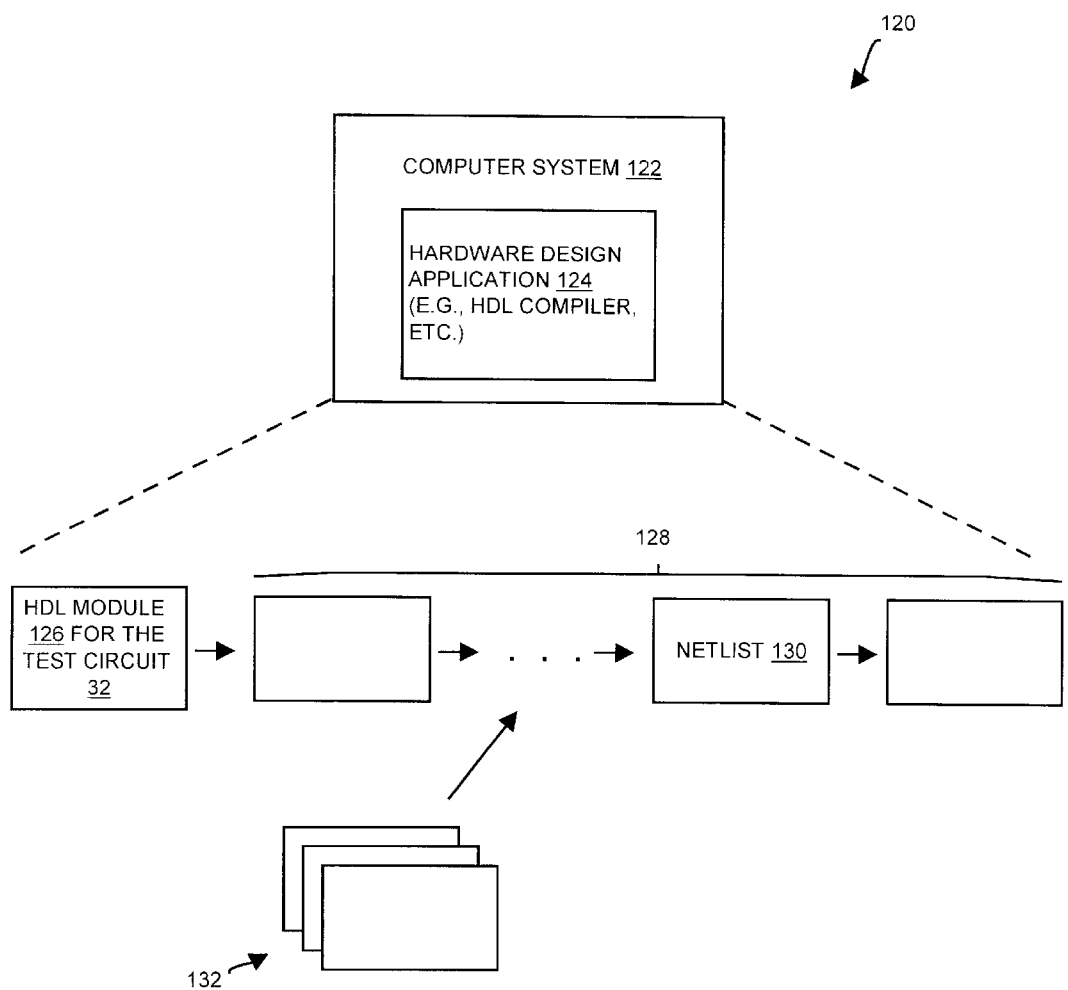
FIG. 6 is a block diagram of a hardware design system which uses an HDL module for the test circuit of the FPGA device of FIG. 1.

It should be understood that a design engineer can include the test circuit 32 in a variety of IC devices. As shown in FIG. 6, in one arrangement, the design engineer uses a development system 120 which includes a computer system 122 running a hardware design application 124. The design engineer creates a representation 126 of the test circuit 32 using Hardware Description Language (HDL), or alternatively using a schematic digital design editor. The representation 126 is a set of instructions which is storable on a tangible medium, i.e., a computer program product such as a diskette, a CDROM, a tape, programmable semiconductor memory, etc. The design engineer then performs a series of implementation, mapping, verification and simulation procedures 128 to produce a design for the complete IC device (e.g., an FPGA device). One of the outputs is a netlist 130 which can be converted into a bitstream file for configuring an FPGA device. Other representations 132 are incorporated into the design to create a complete device such as the FPGA device shown in FIG. 2.

As explained above, the invention is directed to techniques which use a test circuit within an FPGA device to obtain a trace of a digital signal used by normal operating circuitry of the FPGA device. The test circuit stores the trace in memory of the FPGA device which is accessible without the need of a logic analyzer. As a result, the deficiencies of the conventional built-in and soldering approaches are avoided. That is, no logic analyzer is required thus alleviating the need for such expensive equipment, and the time and effort required to connect such equipment. Additionally, there is no sacrifice of circuit board area as in the built-in approach. Rather, the test circuit 32 is included within the same FPGA package as the normal operating circuitry 30. Furthermore, there are no soldered wires required as in the soldering approach thus avoiding any signal distortion that would otherwise be created by solder and soldered wires. Rather, the samples captured by the test circuit 32 are the same samples that are present during normal operation of the FPGA device (i.e., true and accurate real-time/runtime samples). Moreover, incorporation of the test circuit 32 within a device is not limited by a particular circuit board technology, i.e., is not limited by particular IC packaging, mounting technology, pitch, device placement, etc. The features of the invention may be particularly useful when applied to devices manufactured by EMC Corporation of Hopkinton, Mass.

While this invention has been particularly shown and described with references to preferred embodiments thereof, it will be understood by those skilled in the art that various changes in form and details may be made therein without departing from the spirit and scope of the invention as defined by the appended claims.

For example, it should be understood that the arrangement of the busses 34, 36 and 38 is provided by way of example only. In other arrangements, one or more of the busses 34, 36 and 38 are the same. For instance, in one arrangement, the processor 22 communicates with the FPGA device 24 and the memory 26 through the same bus.

Similarly, it should be understood that the configuration of the normal operating circuitry 30 is provided by way of example only. Other circuits which are suitable for the normal operating circuitry 30 do not include the input port 42, the output port 44, or both the input port 42 and the output port 44.

Additionally, it should be understood that the test circuit 32 was described as operating based on rising control signal edges. It should be understood that the test circuit 32 can be configured to operate based on one or more falling signal edges rather than rising signal edges.

Furthermore, it should be understood that the control logic 58 was described as incrementing the counter 62 after each sample capture. Other suitable alternatives are available. For example, the control logic 58 can decrement the counter 62 after each sample capture rather than increment the counter 62 after each sample capture. Also, the samples can be stored in the memory 56 based on the contents of the counter 62 after incrementing (or decrementing), rather than prior to incrementing (or decrementing).

Additionally, it should be understood that some FPGA devices include memory. The normal operating circuitry 30 can utilize a portion of this memory when performing its normal operating function. A portion of this memory can be dedicated for use as the memory 56 of the test circuit 32 (see FIG. 2). Accordingly, the memory 56 can form a portion of a larger contiguous memory (RAM) of the FPGA device 24.

Furthermore, it should be understood that the processor 22 was described as providing the control signals to the FPGA device 24 by way of example only. A user can provide one or more of the control signals directly to the FPGA device 24 as well. However, if the user provides one or more of the control signals directly, the user may need to attach a signal generator to the circuit board which requires additional time and effort on behalf of the user.

Additionally, it should be understood that the multiplexor 60 can be configured to select amount particular portions of the normal operating function logic 40 (e.g., particular gates, registers, state counters, address pointers, etc.). In such an arrangement, the user has the capability to probe internal signals that would not otherwise be available to a logic analyzer which can only probe externally available signals.

Furthermore, it should be understood that the test circuit 32 is capable of obtaining traces of multiple digital signals 66, as explained in the example referencing FIG. 6. Accordingly, the test circuit 32 can obtain traces of all the bits on a particular bus, in a particular register, etc. during a particular clock cycle. As such, the test circuit 32 can capture entire addresses (e.g., a 32-bit wide probing input), entire data segments, individual signals, groups of signals, etc.

What is claimed is:

1. In a field programmable gate array device having (i) normal operating circuitry for performing a normal operating function of the field programmable gate array device and (ii) a test circuit, a method for obtaining a trace of a digital signal used by the normal operating circuitry, the method comprising the steps of:

receiving a select signal;

selecting a portion of the normal operating circuitry from which to capture samples of the digital signal based on the select signal;

receiving a control signal enabling capture of the digital signal used by the normal operating circuitry;

capturing the samples of the digital signal in response to the control signal; and storing the captured samples of the digital signal in the test circuit, the captured samples forming the trace of the digital signal.

2. The method of claim 1 wherein the test circuit includes a counter and memory, and wherein the method further comprises the step of:

receiving an initialization signal; and initializing contents of the counter in response to the initialization signal, the contents of the counter identifying memory locations of the memory for storing samples of the digital signal.

3. The method of claim 1 wherein the test circuit includes a counter and memory, and wherein the method further comprises the step of:

modifying contents of the counter in response to the control signal, the contents of the counter identifying memory locations of the memory for storing samples of the digital signal.

4. The method of claim 1 wherein the step of receiving the select signal includes the step of obtaining the select signal through an input port of the field programmable gate array after the field programmable gate array has been programmed to provide the normal operating circuitry and the test circuit, and wherein the step of selecting the portion of the normal operating circuitry includes the step of selecting, as the portion of the normal operating circuitry, one of multiple selectable portions of the normal operating circuitry in response to the select signal obtained through the input port of the field programmable gate array.

5. The method of claim 4 wherein the step of selecting the one of the multiple selectable portions of the normal operating circuitry includes the step of:

directing operation of a multiplexor of the test circuit, the multiplexor being coupled to each of the multiple selectable portions of the normal operating circuitry.

6. The method of claim 5, further comprising the step of:

modifying the select signal to direct the multiplexor to select another of the multiple selectable portions of the normal operating circuitry without reprogramming the field programmable gate array device.

7. A field programmable gate array device, comprising:

normal operating circuitry for performing a normal operating function of the field programmable gate array device; and a test circuit having (i) a controller coupled to the normal operating circuitry and (ii) memory, the controller including a selector that (i) receives a select signal, and (ii) selects a portion of the normal operating circuitry from which to capture samples of a digital signal based on the select signal, the controller being configured to obtain a trace of the digital signal used by the normal operating circuitry by:

receiving a control signal enabling capture of the digital signal, capturing the samples of the digital signal in response to the control signal, and storing the captured samples of the digital signal in the memory, the captured samples forming the trace of the digital signal.

8. The field programmable gate array device of claim 7 wherein the controller of the test circuit includes:

a counter; and counter initialization circuitry coupled to the counter, the counter initialization circuitry being configured to (i) receive an initialization signal, and (ii) initialize contents of the counter in response to the initialization signal, the contents of the counter identifying memory locations of the memory for storing samples of the digital signal.

9. The field programmable gate array device of claim 7 wherein the controller of the test circuit includes:

a counter; and counter modification circuitry, coupled to the counter, that modifies contents of the counter in response to the control signal, the contents of the counter identifying memory locations of the memory for storing samples of the digital signal.

10. The field programmable gate array device of claim 7 wherein the selector of the controller of the test circuit is configured to obtain the select signal through an input port of the field programmable gate array after the field programmable gate array has been programmed to provide the normal operating circuitry and the test circuit, and wherein the selector of the controller of the test circuit is configured is further configured to select, as the portion of the normal operating circuitry, one of multiple selectable portions of the normal operating circuitry in response to the select signal obtained through the input port of the field programmable gate array.

11. The field programmable gate array device of claim 10 wherein the selector includes a multiplexor coupled to each of the multiple selectable portions of the normal operating circuitry.

12. The field programmable gate array device of claim 11 wherein the multiplexor is configured to select another of the multiple selectable portions of the normal operating circuitry based ion a modification to the select signal without any reprogramming of the field programmable gate array device.

13. In a computer system having a processor and a field programmable gate array device, the field programmable gate array device having (i) normal operating circuitry for performing a normal operating function of the field programmable gate array device and (ii) a test circuit, a method for obtaining a trace of a digital signal used by the normal operating circuitry, the method comprising the steps of:

providing a select signal from the processor to the field programmable gate array in order to select a portion of the normal operating circuitry from which to capture samples of the digital signal based on the select signal;

providing a control signal from the processor to the field programmable gate array device to enable the field programmable gate array device to:

(i) capture the samples of the digital signal in response to the control signal, and (ii) store the captured samples of the digital signal in the test circuit; and reading the captured samples of the digital signal from the test circuit; and providing the captured samples to an output device, the captured samples forming the trace of the digital signal.

14. The method of claim 13 wherein the test circuit includes a counter and memory, and wherein the method further comprises the step of:

providing an initialization signal from the processor to the field programmable gate array device in order to initialize contents of the counter, the contents of the counter identifying memory locations of the memory for storing samples of the digital signal.

15. The method of claim 13 wherein the test circuit includes a counter and memory, and wherein the step of providing the control signal includes the step of:

supplying the control signal to the field programmable gate array device in order to modify contents of the counter, the contents of the counter identifying memory locations of the memory for storing samples of the digital signal.

16. The method of claim 13 wherein the step of providing the select signal includes the step of sending the select signal through an input port of the field programmable gate array after the field programmable gate array has been programmed to provide the normal operating circuitry and the test circuit; the select signal selecting, as the portion of the normal operating circuitry, one of multiple selectable portions of the normal operating circuitry.

17. The method of claim 16 wherein the step of sending the select signal includes the step of:

directing operation of a multiplexor of the test circuit, the multiplexor being coupled to each of the multiple selectable portions of the normal operating circuitry.

18. The method of claim 17 further comprising the step of:

modifying the select signal to direct the multiplexor to select another of the multiple selectable portions of the normal operating circuitry without reprogramming the field programmable gate array device.

19. A computer system, comprising:

a bus;

a processor coupled to the bus; and a field programmable gate array device coupled to the bus, the field programmable gate array device including (i) normal operating circuitry for performing a normal operating function of the field programmable gate array device, and (ii) a test circuit coupled to the normal operating circuitry, the test circuit of the field programmable gate array device including a controller and memory, the controller having a selector that (i) receives a select signal from the processor and through the bus, and (ii) selects a portion of the normal operating circuitry from which to capture samples of a digital signal based on the select signal, the test circuit being configured to obtain a trace of the digital signal used by the normal operating circuitry by:

receiving, from the processor and through the bus, a control signal enabling capture of the digital signal, capturing the samples of the digital signal in response to the control signal, and storing the captured samples of the digital signal in the test circuit, the captured samples forming the trace of the digital signal.

20. The computer system of claim 19 wherein the test circuit of the field programmable gate array device includes a controller and memory, the controller having:

a counter; and counter initialization circuitry coupled to the counter, the counter initialization circuitry being configured to (i) receive an initialization signal from the processor and through the bus, and (ii) initialize contents of the counter in response to the initialization signal, the contents of the counter identifying memory locations of the memory for storing samples of the digital signal.

21. The computer system of claim 19 wherein the test circuit of the field programmable gate array device includes a controller and memory, the controller having:

a counter; and counter modification circuitry, coupled to the counter, that modifies contents of the counter in response to the control signal, the contents of the counter identifying memory locations of the memory for storing samples of the digital signal.

22. The computer system of claim 19 wherein the selector of the controller of the test circuit is configured to obtain the select signal through an input port of the field programmable gate array after the field programmable gate array has been programmed to provide the normal operating circuitry and the test circuit, and wherein the selector of the controller of the test circuit is further configured to select, as the portion of the normal operating circuitry, one of multiple selectable portions of the normal operating circuitry in response to the select signal obtained through the input port of the field programmable gate array.

23. The computer system of claim 22 wherein the selector includes a multiplexor coupled to each of the multiple selectable portions of the normal operating circuitry.

24. The computer system of claim 23 wherein the multiplexor is configured to select another of the multiple selectable portions of the normal operating circuitry based on a modification to the select signal without any reprogramming of the field programmable gate array device.

25. A computer program product that includes a computer readable medium having instructions stored thereon defining a test circuit for a field programmable gate array device, such that the instructions, when processed by a computer running a hardware design application, cause the computer to generate a computer representation of the test circuit, the test circuit being configured to:

receive a select signal;

select a portion of normal operating circuitry of the field programmable gate array device from which to capture samples of a digital signal based on the select signal;

receive a control signal enabling capture of the digital signal used by the normal operating circuitry of the field programmable gate array device;

capture the samples of the digital signal in response to the control signal; and store the captured samples of the digital signal in the test circuit, the captured samples forming a trace of the digital signal.

26. The computer program product of claim 25 wherein the instructions are hardware description language instructions.

27. The computer program product of claim 25 wherein the test circuit includes a multiplexor coupled to each of multiple selectable portions of the normal operating circuitry, wherein the multiplexor is configured to obtain the select signal through an input port of the field programmable gate array after the field programmable gate array has been programmed to provide the normal operating circuitry and the test circuit, and wherein the multiplexor is further configured to select, as the portion of the normal operating circuitry, one of the multiple selectable portions of the normal operating circuitry in response to the select signal obtained through the input port of the field programmable gate array.

28. A field programmable gate array device, comprising:

normal operating circuitry for performing a normal operating function of the field programmable gate array device; and a test circuit having (i) memory and (ii) means, coupled to the normal operating circuitry, for obtaining a trace of a digital signal used by the normal operating circuitry by:

receiving a control signal enabling capture of the digital signal, capturing samples of the digital signal in response to the control signal, and storing the captured samples of the digital signal in the memory, the captured samples forming the trace of the digital signal;

wherein the means for obtaining includes:

means for receiving a select signal, and selecting a portion of the normal operating circuitry from which to capture the samples of the digital signal based on the select signal.

29. The field programmable gate array device of claim 28 wherein the means for receiving and selecting includes means for obtaining the select signal through an input port of the field programmable gate array after the field programmable gate array has been programmed to provide the normal operating circuitry and the test circuit, the means for obtaining being coupled to each of the multiple selectable portions of the normal operating circuitry.

* * * * *

UNITED STATES PATENT AND TRADEMARK OFFICE
CERTIFICATE OF CORRECTION

PATENT NO. : 6,681,353 B1 Page 1 of 1
DATED : January 20, 2004
INVENTOR(S) : Jonathan J. Barrow It is certified that error appears in the above-identified patent and that said Letters Patent is hereby corrected as shown below:

Column 10,
Line 50, "based ion a" should read -- based on a --.

Signed and Sealed this

Fourth Day of May, 2004

JON W. DUDAS
*Acting Director of the United States Patent and Trademark Office*